US012772520B2

(12) United States Patent
Hsieh et al.

(10) Patent No.: US 12,772,520 B2
(45) Date of Patent: Oct. 20, 2026

(54) STRUCTURE AND METHOD FOR HIGH-VOLTAGE DEVICE

(71) Applicant: Taiwan Semiconductor Manufacturing Company, Ltd., Hsin-Chu (TW)

(72) Inventors: YuYing Hsieh, Taichung City (TW); Cheng-Chien Li, Hsinchu County (TW); Huei-Shan Wu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 438 days.

(21) Appl. No.: 18/352,847

(22) Filed: Jul. 14, 2023

(65) Prior Publication Data

US 2024/0274669 A1 Aug. 15, 2024

Related U.S. Application Data

(60) Provisional application No. 63/484,155, filed on Feb. 9, 2023.

(51) Int. Cl.
*H10W 10/17* (2026.01)
*H10D 30/01* (2025.01)
(Continued)

(52) U.S. Cl.
CPC ....... *H10D 62/307* (2025.01); *H10D 30/0281* (2025.01); *H10D 30/65* (2025.01);
(Continued)

(58) Field of Classification Search
CPC .. H10D 62/307; H10D 30/0281; H10D 30/65; H10D 62/116; H10D 62/155;
(Continued)

(56) References Cited

U.S. PATENT DOCUMENTS

2011/0039387 A1 2/2011 Wei et al.
2012/0037987 A1 2/2012 Chou et al.
(Continued)

FOREIGN PATENT DOCUMENTS

KR 1020140008232 A 1/2014
KR 1020210086460 A 7/2021
(Continued)

*Primary Examiner* — Theresa T Doan
(74) *Attorney, Agent, or Firm* — HAYNES AND BOONE, LLP

(57) ABSTRACT

An IC structure includes a semiconductor substrate; an isolation structure formed in the semiconductor substrate, thereby defining active regions surrounded by the isolation feature; a first well of a first conductivity type formed in the semiconductor substrate; a neutral region formed in the semiconductor substrate and laterally surrounding the first well; a second well of a second conductivity type formed on the semiconductor substrate and laterally surrounding the neutral region, the second conductivity type being opposite to the first conductivity type; a source disposed on the second well of the semiconductor substrate; a drain disposed on the first well of the semiconductor substrate; and a gate structure interposed between the source and the drain. The gate structure is engaging the first well, the neutral region and the second well of the semiconductor substrate. The source, the drain and the gate structure are configured as a FET.

20 Claims, 8 Drawing Sheets

(51) Int. Cl.

| | |
|---|---|
| ***H10D 30/65*** | (2025.01) |
| ***H10D 62/10*** | (2025.01) |
| ***H10D 62/13*** | (2025.01) |
| ***H10D 62/17*** | (2025.01) |
| ***H10D 84/83*** | (2025.01) |

(52) U.S. Cl.
CPC ......... *H10D 62/116* (2025.01); *H10D 62/155* (2025.01); *H10D 84/83* (2025.01)

(58) Field of Classification Search
CPC ...... H10D 84/83; H10D 30/603; H10D 30/62; H10D 64/111; H10D 62/117; H10D 62/127; H10D 84/0133; H10D 84/038; H10D 30/024; H10D 84/853; H10D 62/115
USPC .......................................................... 257/213
See application file for complete search history.

(56) References Cited

U.S. PATENT DOCUMENTS

| | | | | |
|---|---|---|---|---|
| 2015/0270391 | A1* | 9/2015 | Tamura .................. | H10D 84/83 257/343 |
| 2018/0269198 | A1 | 9/2018 | Huang et al. | |
| 2020/0118997 | A1 | 4/2020 | Lee et al. | |
| 2021/0336054 | A1 | 10/2021 | Yang et al. | |

FOREIGN PATENT DOCUMENTS

| | | | |
|---|---|---|---|
| TW | I608594 | B | 12/2017 |
| TW | 202021132 | A | 6/2020 |
| TW | 202114212 | A | 4/2021 |

* cited by examiner

STRUCTURE AND METHOD FOR HIGH-VOLTAGE DEVICE

PRIORITY DATA

This application claims priority to U.S. Provisional Patent Application Ser. No. 63/484,155 filed on Feb. 9, 2023, the entire disclosure of which is hereby incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC processing and manufacturing, and for these advancements to be realized, similar developments in IC processing and manufacturing are needed. For example, high voltage field-effect transistors (FETs) for high voltage applications face various challenges including breakdown voltage, ON state channel resistance, drain saturation current, OFF state current, signal/noise ratio, and etc. Therefore, although conventional high voltage FETs have been generally adequate for their intended purposes, they are not satisfactory in every respect.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
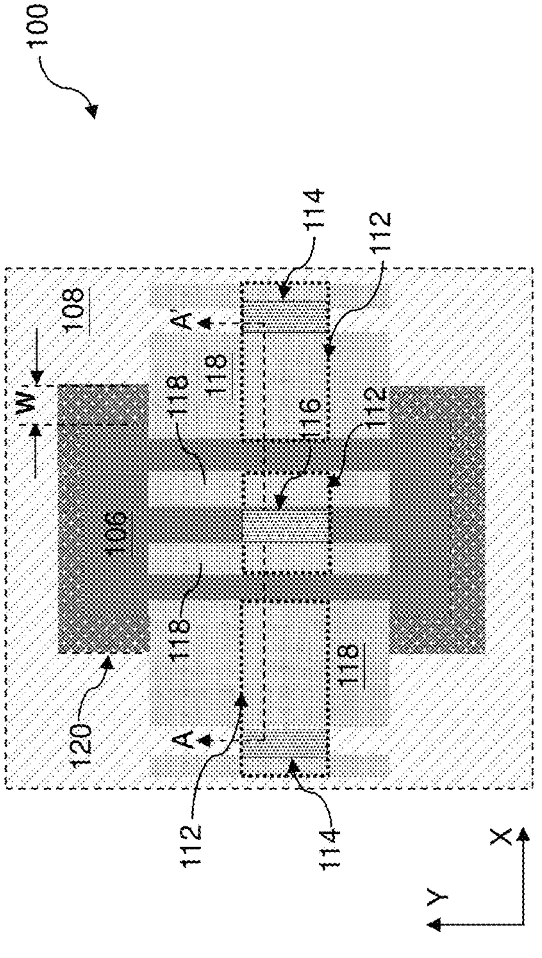
FIG. 1A is a top view of an integrated circuit (IC) structure having one or more FET device according to some embodiments of the present disclosure.

The following disclosure provides many different embodiments, or examples, for implementing different features. Reference numerals and/or letters may be repeated in the various examples described herein. This repetition is for the purpose of simplicity and clarity and does not in itself dictate a relationship between the various disclosed embodiments and/or configurations. Further, specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. Moreover, the formation of a feature on, connected to, and/or coupled to another feature in the present disclosure may include embodiments in which the features are formed in direct contact, and may also include embodiments in which additional features may be formed interposing the features, such that the features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, “lower,” “upper,” “horizontal,” “vertical,” “above,” “over,” “below,” “beneath,” “up,” “down,” “top,” “bottom,” etc. as well as derivatives thereof (e.g., “horizontally,” “downwardly,” “upwardly,” etc.) are used for ease of the present disclosure of one feature relationship to another feature. The spatially relative terms are intended to cover different orientations of the device including the features. Still further, when a number or a range of numbers is described with “about,” “approximate,” and the like, the term is intended to encompass numbers that are within a reasonable range including the number described, such as within +/−10% of the number described, or other values as understood by person skilled in the art. For example, the term “about 5 nm” encompasses the dimension range from 4.5 nm to 5.5 nm.

The present disclosure relates generally to an integrated circuit (IC) structure and a method making the same, and more particularly, to a high voltage field-effect transistor (FET) structure. In various embodiments, the IC structure includes planar FET structure, and multi-gate devices, such as FETs formed on fin active regions, and nanosheet structure with multiple channels vertically stacked on each other in an effort to improve gate control by increasing gate-channel coupling, reduce OFF-state current, and reduce short-channel effects (SCEs).

The disclosed FET structure is formed on a planar active region as a planar FET device, and alternatively is formed on a three-dimensional (3D) structure, such as multi-gate FET devices. Examples of multi-gate devices include fin-like field effect transistors (FinFETs) having fin-like structures and multi-bridge-channel (MBC). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor having a plurality of channel members vertically stacked. The IC structure may include other suitable device structure, such as forksheet FETs, and complimentary FET (CFET) structure. The IC structure and the method making the same are collectively described in detail according to various embodiments of the present disclosure.

Figure 1B:
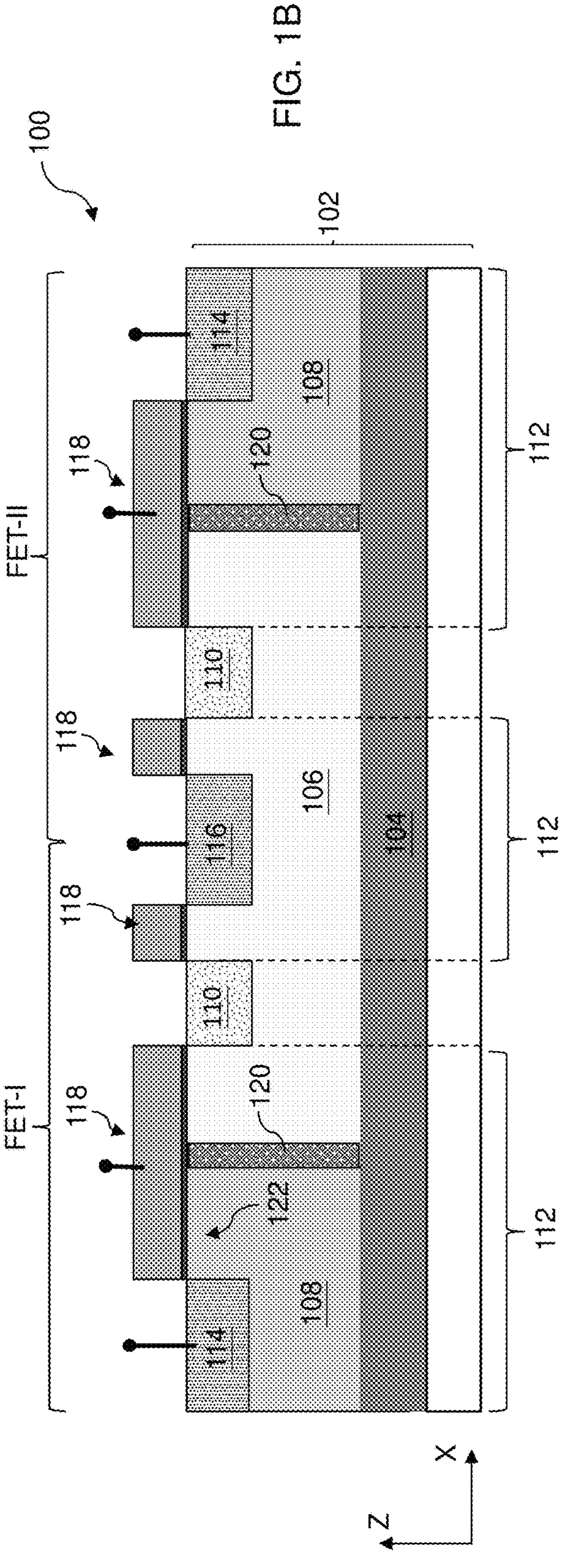
FIG. 1B is a cross-sectional view of the IC structure of FIG. 1A according to some embodiments of the present disclosure.

FIG. 1A is a top view of an IC structure 100 having one or more FET, and FIG. 1B is a sectional view of an IC structure 100 cut along the dashed line AA', constructed according to various embodiments. In the present embodiment, the FET of the IC structure 100 is designed for high voltage application, therefore also being referred to as high voltage FET (HVFET). In the disclosed embodiments of the IC structure 100, one or more n-type FET (nFET), is provided as an example for illustration. However, it is not intended to be limiting, the IC structure 100 may, additionally, or alternatively, include one or more p-type FET (pFET). In FIGS. 1A and 1B, the IC structure 100 includes two field-effect transistors configured side by side, especially sharing a common drain.

The IC structure 100 includes a substrate 102. The substrate 102 is a semiconductor substrate. The semiconductor substrate 102 includes silicon. In some other embodiments, the substrate 102 includes germanium, silicon germanium or other proper semiconductor materials. The substrate 102 may alternatively be made of some other suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide.

The substrate 102 may include a buried layer such as an N-type buried layer (NBL), a P-type buried layer (PBL), and a buried dielectric layer including a buried oxide (BOX) layer according to various embodiments. In the disclosed embodiment, the substrate 102 includes a P-type doped region 104 at a deep level of the substrate 102. The p-type dopant includes boron, gallium, indium, other suitable p-type dopant, or a combination thereof. The p-type doped region 104 is, therefore, also referred to as deep P-well 104. In some embodiments, the substrate 102 may include a BOX layer under the deep P-well 104. The deep P-well 104 may be formed by ion implantation and the BOX layer may be formed by a method referred to as separation by implanted oxygen (SIMOX).

The substrate 102 also includes a N-well region (or simply N-well) 106 (also referred to as high voltage N-well or HVNW) and a P-well region (or simply P-well) 108 formed over the deep P-well 104. The P-well 108 is configured to surround and enclose the N-well 106 in the top view, as illustrated in FIG. 1A. The N-well 106 and P-well 108 are formed by suitable method, such as ion implantation with proper dopant, implantation energy and doping dosage to achieve the desired doping type, doping level, doping thickness, and doping concentration. In the top view as illustrated in FIG. 1A, the P-well 108 is surrounding and enclosing the N-Well 106 according to the disclosed embodiment. The P-well 108 is doped with a P-type dopant such as boron, and the N-well 106 is doped with an N-type dopant such as phosphorus. In another embodiment, the N-well 106 and P-well 108 may be formed, respectively, by any suitable procedure having a plurality of processing steps, such as forming a patterned mask by a lithography process and patterning, applying an ion implantation process to the substrate 102 through the opening of the patterned mask, and removing the patterned mask afterward. In the disclosed embodiment, the N-well 106 functions as a drift region of a nFET to be formed and the P-well 108 provides a channel 122 of the nFET.

Furthermore, a neutral region 120 is inserted between the N-well 106 and the P-well 108 such that the neutral region 120 surrounds and encloses the N-well 106 and the P-well 108 surrounds and encloses the neutral region 120 in the top view, as illustrated in FIG. 1A. The neutral region 120 is designed to improve the performance of the IC structure 100, especially the performance of the high voltage FET, which includes increased breakdown voltage, reduced the resistance of the HVFET in On-state, and reduced electrical current of the HVFET in Off-state.

The neutral region 120 is a region of the semiconductor substrate 102 with no dopant. This can be achieved through a suitable method, such as redesigning the photomasks used to form the N-well 106 and the P-well 108 such that the neutral region 120 is not implanted. The neutral region 120 includes an inner edge continuously contacting the N-well 106 and an outer edge continuously contacting the P-well 108. The neutral region 120 spans a width W between the N-well 106 and the P-well 108. The width W is properly designed according to theoretical analysis and experiments. As indicated above, the disclosed neutral region 120 introduces benefits, such as increased breakdown voltage and decreased leakage current. However, the neutral region 120 also impacts other factors, such as increasing the parasitic capacitance, which in turn impacts switching behavior, and degrades frequency response. Therefore, the design of the neutral region 120 need considers various factors to achieve the desired performance improvements while minimizing any potential drawbacks. In the disclosed embodiment, the width W ranges between 0.01 μm and 5 μm.

The IC structure 100 also includes an isolation structure 110 formed on the substrate 102, thereby defining active regions 112, which are semiconductor surface regions for active devices (such as FETs) to be formed thereon. In the IC structure 100 illustrated in FIG. 1B, the active regions 112 are planar, fin-like, or a combination thereof (also being referred to as hybrid active regions). The fin-like active regions are three-dimensional (3D) active region to increase coupling between the channels and the gates. However, it is not intended to be limiting. The active regions can have any proper profile, such as other suitable 3D profile.

The isolation structure 110 includes one or more dielectric material and provides separation and isolation among various devices formed on the active regions 112. The isolation structure 110 may be formed by any suitable method and may have any proper geometry, such as a stepwise profile with different thickness, which will be further described in detail later. In the disclosed embodiment, the isolation structure 110 includes shallow trench isolation (STI) features (also referred to by numeral 110) formed on the substrate 102. In some embodiments, the STI features 110 are formed by a suitable procedure that includes patterning to form trenches, filling the trenches with dielectric material and polishing to remove the excessive dielectric material and planarize the top surface. The patterning process includes a lithography process, etching, and may further include forming a patterned hard mask. One or more etching processes are performed on the substrate 102 through openings of soft mask or hard mask, which are formed by lithography patterning and etching. The formation of the STI features 110 are further described below in accordance with some embodiments.

In the present example, a hard mask is deposited on the substrate 102 and is patterned by lithography process. The hard mask includes a dielectric material, such as silicon oxide, silicon nitride, silicon oxynitride, and/or other suitable material, such as metal oxide. In an embodiment, the hard mask includes a silicon oxide film and a silicon nitride film. The hard mask may be formed by thermal growth, atomic layer deposition (ALD), chemical vapor deposition (CVD), high density plasma CVD (HDP-CVD), other suitable deposition processes, or a combination thereof.

A photoresist layer (or resist) used to define the isolation structure 110 may be formed on the hard mask. A resist layer includes a photosensitive material that causes the layer to undergo a property change when exposed to light, such as ultraviolet (UV) light, deep UV (DUV) light or extreme UV (EUV) light. This property change can be used to selectively remove exposed or unexposed portions of the resist layer by a developing process referred. This procedure to form a patterned resist layer is also referred to as lithographic process.

In one embodiment, the resist layer is patterned to leave the portions of the photoresist material disposed over the substrate 102 by the lithography process. After patterning the resist, an etching process is performed on the substrate 102 to open the hard mask, thereby transferring the pattern from the resist layer to the hard mask. The remaining resist layer may be removed after the patterning the hard mask. A lithography process includes spin-on coating a resist layer, soft baking of the resist layer, mask aligning, exposing, post-exposure baking, developing the resist layer, rinsing, and drying (e.g., hard baking). Alternatively, a lithographic process may be implemented, supplemented, or replaced by other suitable methods such as mask-less photolithography, electron-beam writing, and ion-beam writing. The etching process to pattern the hard mask may include wet etching, dry etching or a combination thereof. The etching process may include multiple etching steps. For example, the silicon oxide film in the hard mask may be etched by a diluted hydro-fluorine solution and the silicon nitride film in the hard mask may be etched by a phosphoric acid solution.

Then etching process may be followed to etch the portions of the substrate 102 not covered by the patterned hard mask. The patterned hard mask is used as an etch mask during the etching processes to pattern the substrate 102. The etching processes may include any suitable etching technique such as dry etching, wet etching, and/or other etching methods (e.g., reactive ion etching (RIE)). In some embodiments, the etching process includes multiple etching steps with different etching chemistries, designed to etching the substrate to form the trenches with particular trench profile for improved device performance and pattern density. In some examples, the semiconductor material of the substrate 102 may be etched by a dry etching process using a fluorine-based etchant. Particularly, the etching process applied to the substrate 102 is controlled such that the substrate 102 is partially etched. This may be achieved by controlling etching time or by controlling other etching parameters. After the etching processes, the active regions 112 are defined on the substrate 102 and are extruded above the isolation structure 110.

One or more dielectric material is filled in the trenches to form the STI feature 110. Suitable dielectric materials to fill the trenches include semiconductor oxides, semiconductor nitrides, semiconductor oxynitrides, fluorinated silica glass (FSG), low-K dielectric materials, and/or combinations thereof. In various embodiments, the dielectric material is deposited using an HDP-CVD process, a sub-atmospheric CVD (SACVD) process, a high-aspect ratio process (HARP), a flowable CVD (FCVD), and/or a spin-on process.

The deposition of the dielectric material may be followed by a chemical mechanical polishing/planarization (CMP) process to remove the excessive dielectric material and planarize the top surface of the semiconductor structure. The CMP process may use the hard mask layers as a polishing stop layer to prevent polishing the semiconductor substrate 102. In some embodiments, the CMP process completely removes the hard mask. Alternatively, the hard mask may be removed by an etching process. Although in further embodiments, portions of the hard mask remain after the CMP process.

In some embodiments, the method further includes forming the fin active regions 112 by a suitable method, such as etching back the STI structure 110 such that the STI features 110 are recessed and the active regions 112 are extruded above the STI features 110. The etching back process employs one or more etching steps (such as dry etch, wet etch or a combination thereof) to selectively etch back the STI features 110. For example, a wet etching process using hydrofluoric acid may be used to etch when the STI features 110 are silicon oxide features. Alternatively, the fin active regions 112 are formed by epitaxially growing one or more semiconductor material(s) such that the fin active regions 112 are extruded above the STI features 110.

In some embodiments, a STI feature 110 includes various regions with different thicknesses and is designed to reduce the leakage current. This will be further described in detail later, such as in FIGS. 2A, 2B, 3A and 3B.

The active regions 112 are spaced from each other. The active regions 112 may have elongated shape longitudinally oriented along a first direction (X direction). A second direction (Y direction) is orthogonal to the X direction. The X and Y axes define the top surface of the substrate 102. The STI feature 110 includes two extended portions to define three active regions: a first, a second and a third active region, which are illustrated in FIG. 1A and more clearly illustrated in FIG. 2A.

Especially, the first active region 112 is directly formed on the N-well 106 and is disposed within the N-well 106. The first active region spans between the two extended portions of the STI feature 110 along the X direction. The second active region 112 is disposed on one side (such as left side) of the first active region 112 and is extending from the STI feature 110 over the N-well 106, the neutral region 120 and the P-well 108 along the X direction. The third active region 112 is disposed on another side (such as right side) of the first active region 112 and is extending from the STI feature 110 over the N-well 106, the neutral region 120 and the P-well 108 along the X direction. As noted above, the active regions 112 may be hybrid active regions that includes planar active regions and fin active regions.

One or more FET is formed on the active region 112. A FET includes a source feature (or simply source) 114, a drain feature (or simply drain) 116, and a gate structure 118 interposed between the source 114 and the drain 116. The source 114 and drain 116 are formed in the substrate 102 while the gate structure 118 is formed on the substrate 102. In the disclosed embodiment illustrated in FIGS. 1A and 1B, the IC structure 100 includes two nFETs (FET-I and FET-II) sharing a common drain 116.

The gate structure 118 includes a gate stack that may further include a gate dielectric layer and a gate electrode disposed on the gate dielectric layer. The gate dielectric layer includes one or more dielectric material, such as silicon oxide, high-k dielectric material, other suitable dielectric material or a combination thereof. In some embodiments, the gate dielectric layer includes one or more high-k dielectric material and may further includes an interfacial layer (such as silicon oxide) interposed between the channel and the high-k dielectric material. The high-k dielectric material may include metal oxide, metal nitride, such as LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), or other suitable high-k dielectric materials. The interfacial layer may include silicon oxide, silicon nitride, silicon oxynitride, and/or other suitable material. The interfacial layer may be formed by a suitable method, such as atomic layer deposition (ALD), CVD, ozone oxidation, etc. The high-k dielectric layer is deposited on the interfacial layer (if the interfacial layer presents) by a suitable technique, such as ALD, CVD, metal-organic CVD (MOCVD), PVD, thermal oxidation, combinations thereof, and/or other suitable techniques.

The gate electrode includes one or more conductive material, such as doped polysilicon, metal or metal alloy. The metal in the gate electrode includes aluminum, copper, tungsten, ruthenium, cobalt, nickel, metal silicide, other suitable metal-containing conductive material, or a combination thereof. In some embodiments, the gate electrode may include Ti, Ag, Al, TiAlN, TaC, TaCN, TaSiN, Mn, Zr, TiN, TaN, Ru, Mo, WN, Cu, W, any suitable materials, or a combination thereof.

In some embodiments, the gate electrodes include other materials, such as work function metal, which is used to reduce the threshold voltages of the corresponding FETs. The work function metal used in the gate electrodes are different from n-type FETs (nFETs) and p-type FETs (pFETs), and thus may be separately formed. The work functional (WF) metal layer includes a conductive layer of metal or metal alloy with proper work function such that the corresponding FET is enhanced for its device performance. The work function metal layer is different for a pFET and a nFET, respectively referred to as an n-type WF metal and a p-type WF metal. The choice of the WF metal depends on the FET to be formed on the active region. For example, the n-type WF metal and the p-type WF metal are respectively formed in the corresponding gate stacks. Particularly, an n-type WF metal includes a metal having a first work function such that the threshold voltage of the associated nFET is reduced. The n-type WF metal is close to the silicon conduction band energy (Ec) or lower work function, presenting easier electron escape. For example, the n-type WF metal has a work function of about 4.2 eV or less. A p-type WF metal includes a metal having a second work function such that the threshold voltage of the associated pFET is reduced. The p-type WF metal is close to the silicon valence band energy (Ev) or higher work function, presenting strong electron bonding energy to the nuclei. For example, the p-type work function metal has a WF of about 5.2 eV or higher. In some embodiments, the n-type WF metal includes tantalum (Ta). In other embodiments, the n-type WF metal includes titanium aluminum (TiAl), titanium aluminum nitride (TiAlN), or combinations thereof. In other embodiments, the n-type WF metal include Ta, TiAl, TiAlN, tungsten nitride (WN), or combinations thereof. The n-type WF metal may include various metal-based films as a stack for optimized device performance and processing integration. In some embodiments, the p-type WF metal includes titanium nitride (TiN) or tantalum nitride (TaN). In other embodiments, the p-metal include TiN, TaN, tungsten nitride (WN), titanium aluminum (TiAl), or combinations thereof. The p-type WF metal may include various metal-based films as a stack for optimized device performance and processing integration. The work function metal is deposited by a suitable technique, such as physical vapor deposition (PVD) or ALD.

The gate structures 118 may further include gate sidewall features (or gate spacers) formed on the sidewalls of the gate electrode. The gate spacers provide isolation between gate electrode and source/drain features and may be used to offset the subsequently formed source/drain features and may be used for designing or modifying the source/drain structure profile. The gate spacers may include any suitable dielectric material, such as a semiconductor oxide, a semiconductor nitride, a semiconductor carbide, a semiconductor oxynitride, other suitable dielectric materials, and/or combinations thereof. The gate spacers may have multiple films, such as two films (a silicon oxide film and a silicon nitride film) or three films ((a silicon oxide film; a silicon nitride film; and a silicon oxide film). The formation of the gate spacers includes deposition and anisotropic etching, such as dry etching.

The formation of the gate structure 118 includes depositing various gate materials and patterning the deposited gate materials using a procedure that includes a lithography process and etching. In some embodiments, the gate structure 118 may be formed by a gate replacement procedure, in which a dummy gate structure is formed and is replaced at later stage, such as after the formation of the source 114 and drain 116, to avoid undesired impact of a thermal process to the gate structure 118.

In some embodiments, the gate structure 118 is fragmented to have multiple segments for various fabrication benefits, such as tuning the pattern density and improving processing (such as CMP) uniformity. In the disclosed embodiment, the gate structure 118 for the first nFET (FET-I) includes a first segment interposed between the drain 116 and the STI feature 110; and a second segment interposed between the source 114 and the STI feature 110. In furtherance of the embodiment, the first segment of the gate structure 118 is formed for the fabrication benefits and is floating, which means that it is not configured to be biased and is not functions as a gate of the first nFET. The second segment of the gate structure 118 is configured to be connected to a power signal line so that it is biased as the functional gate of the first nFET. Due to different functions of the first and second segments of the gate structure 118, the first and second segments may be designed with different dimensions. For example, the second segment may have a dimension along the X direction greater than that of the first segment. Especially, the second segment of the gate structure 118 is landing on the P-well 108, the neutral region 120 and the N-well 106. The second segment of the gate structure 118 capacitively couple to the P-well 108 so to control the channel 122 of the first nFET. The channel 122 is the portion of the P-well 108 underlying the second segment of the gate structure 118. The second nFET (FET-II) is similar to the first nFET in terms of layout and configuration. For example, the gate structure of the second nFET also includes two segments, one segment is floating and is disposed between the drain 116 and STI feature 110; and another segment is biased and is disposed between the drain 116 and the source 114.

The source 114 and the drain 116 are semiconductor features doped with proper dopant. For example, in the embodiment illustrated in FIGS. 1A and 1B, a nFET is formed, and the source 114 and the drain 116 are doped with an N-type dopant, such as phosphorous. It is only illustrative not intended to be limiting. It is understood that one or more pFET is alternatively or additionally formed. For a pFET, the source 114 and the drain 116 are doped with p-type dopant. Furthermore, the doped wells 106 and 108 are swapped to be P-type well and N-type well accordingly.

In some embodiments, the source 114 and drain 116 are formed by diffusion or ion implantation. In some embodiments, the source 114 and the drain 116 are formed by a procedure that includes etching the substrate 102 to form source/drain (S/D) recesses in the S/D regions; and epitaxially growing one or more semiconductor material, such as silicon, or silicon germanium to achieve the strain effect with enhanced carrier mobility. In this case, the dopant may be introduced into the source 114 and the drain 116 during the epitaxial growth. In some embodiments, a thermal annealing process may be followed to activate the source 114 and the drain 116.

In the described embodiment illustrated in FIGS. 1A and 1B, the IC structure 100 includes two nFETs disposed side by side with a common drain 116. As illustrated in FIG. 1B, the source 114 on the left side, the drain 116 and the portions of the gate structure 118 (such as the second segment) on the left side of the drain 116 constitute a first nFET (FET-I); and the source 114 on the right side, the drain 116 and the portions of the gate structure 118 on the right side of the drain 116 constitute a second nFET (FET-II). The first and second nFETs share a common drain 116. Especially, the common drain 116 is formed in the N-well 106 while the sources 114 are formed in the P-well 108.

Particularly, the IC structure 100 is designed with various features to enhance the circuit performance, as further described below with FIGS. 1A and 1B and other figures. The IC structure 100 includes the neutral region 120 surrounding and enclosing the N-well 106. This can be achieved by the layouts of N-well 106 and P-well 108 without extra processing cost and ion implantations. For example, the photomask that defines the N-well 106 and the photomask that defines the P-well 108 are designed with shapes and dimensions such that when they formed on the substrate 102 by ion implantations using the photomasks during the ion implantations. The width W of the neutral region 120 depends on other device dimensions and is designed to enhance the performance of the IC structure 100. In the disclosed embodiment, the width W of the neutral region 120 ranges between 0.01 μm and 5 μm.

The N-well 106 functions as a drift region, which is a region that is responsible for controlling the voltage in the device. In a FET, the drift region is the region between the source and the drain where the electric field is high enough to cause the electrons to drift towards the drain. The drift region is typically made of a lightly doped material with a low concentration of impurities. In high voltage FETs, the drift region is designed to handle high voltages and minimize the electric field strength, thereby preventing breakdown.

The portion of the P-well 108 underlying the corresponding gate structure 118 functions as the channel 122 for the current to flow from the source 114 to the drain 116 when the FET is turned on.

The IC structure 100 includes a STI feature 110 formed in the N-well 106 designed for high voltage application. In some embodiment, the STI feature 110 in the N-well 106 is designed to have a loop to enclose the drain 116.

The gate structure 118 is designed with a fragmented structure having a plurality of segments. Those segments of the gate structure 118 for one FET are electrically biased to a same power line to control the corresponding the FET. In some embodiments, those segments of the gate structure 118 are longitudinally oriented along Y direction. For example, the gate structure 118 in the first nFET ((FET-I) includes a first segment disposed between the drain 116 and the STI feature 110 and a second segment disposed between the source 114 and the STI feature 110. The first and second segments of the gate structure 118 are interposed by the STI feature 110. In the disclosed example, the gate structure 118 in the first nFET ((FET-I) has a similar fragmented structure. The gate structure 118 in the second nFET ((FET-II) includes a third segment disposed between the drain 116 and the STI feature 110 and a fourth segment disposed between the corresponding source 114 and the STI feature 110. The two segments of the gate structure 118 in the second nFET are interposed by the STI feature 110.

The disclosed IC structure 100 is designed to effectively distribute the electric field and optimize the parameters and enhanced performance, such as increased breakdown voltage, reduced On-state channel resistance and reduced Off-state channel current. Furthermore, the STI feature 110 includes a stepwise structure having different portions with different thicknesses; and the active regions 112 are designed to have a hybrid structure that includes both fin active regions and planar active regions, which are further described below with other figures.

Figure 2A:
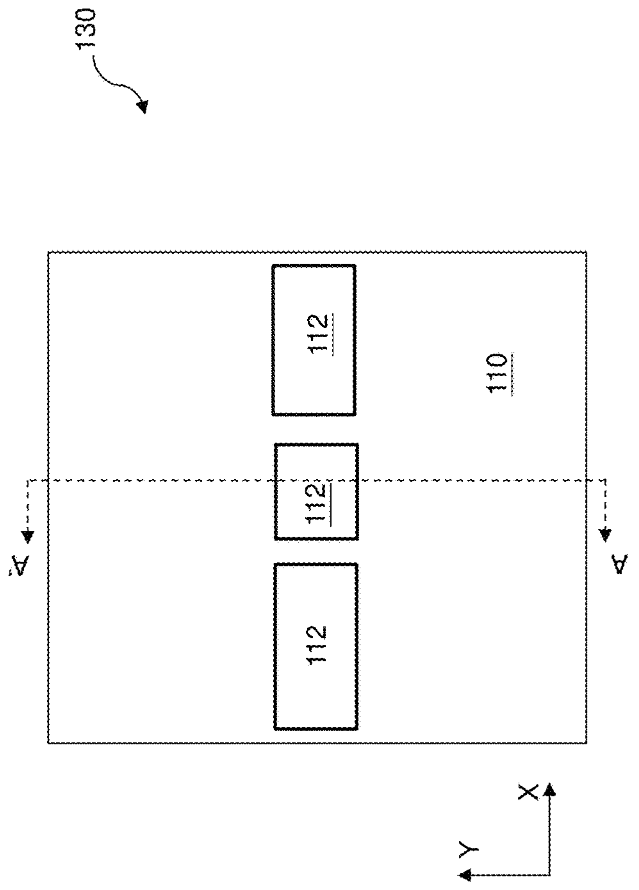
FIG. 2A is a top view of an IC structure, in portion, according to some embodiments of the present disclosure.
Figure 2B:
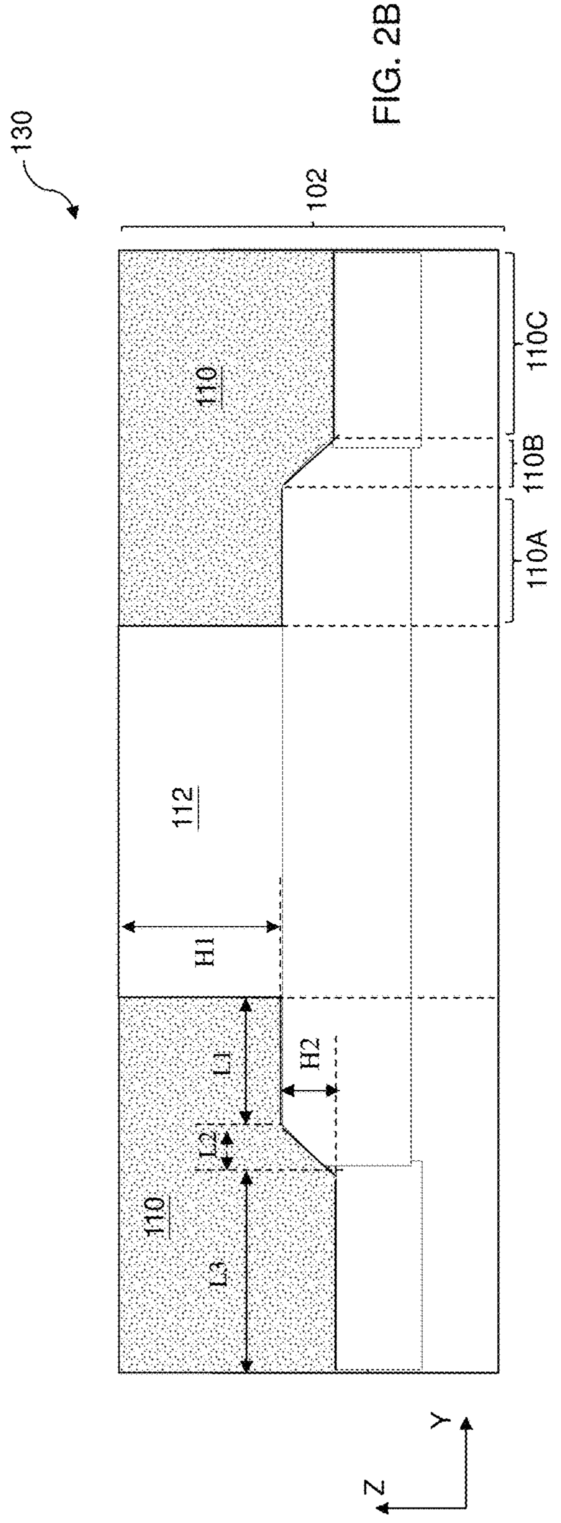
FIG. 2B is a cross-sectional view of the IC structure of FIG. 2A, in portion, according to some embodiments of the present disclosure.
Figure 3A:
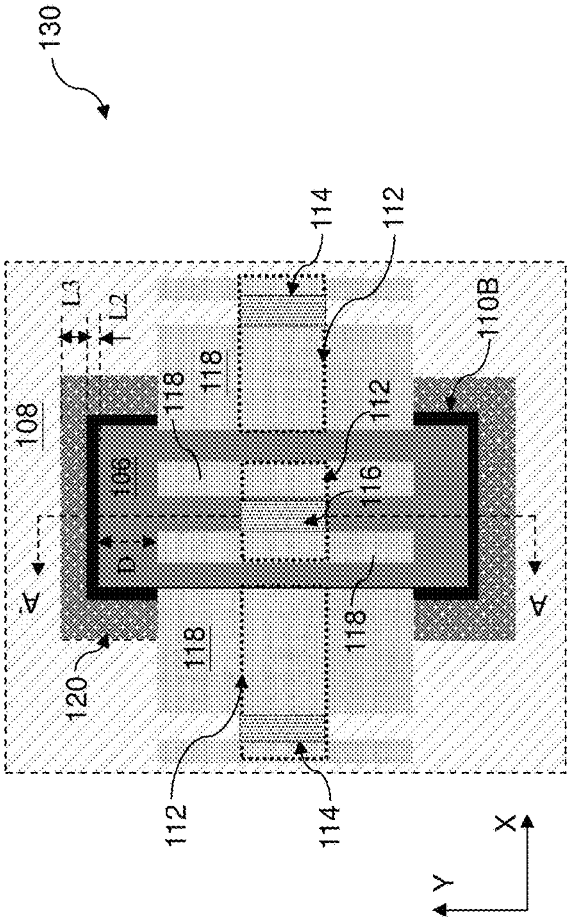
FIG. 3A is a top view of an IC structure according to some embodiments of the present disclosure.
Figure 3B:
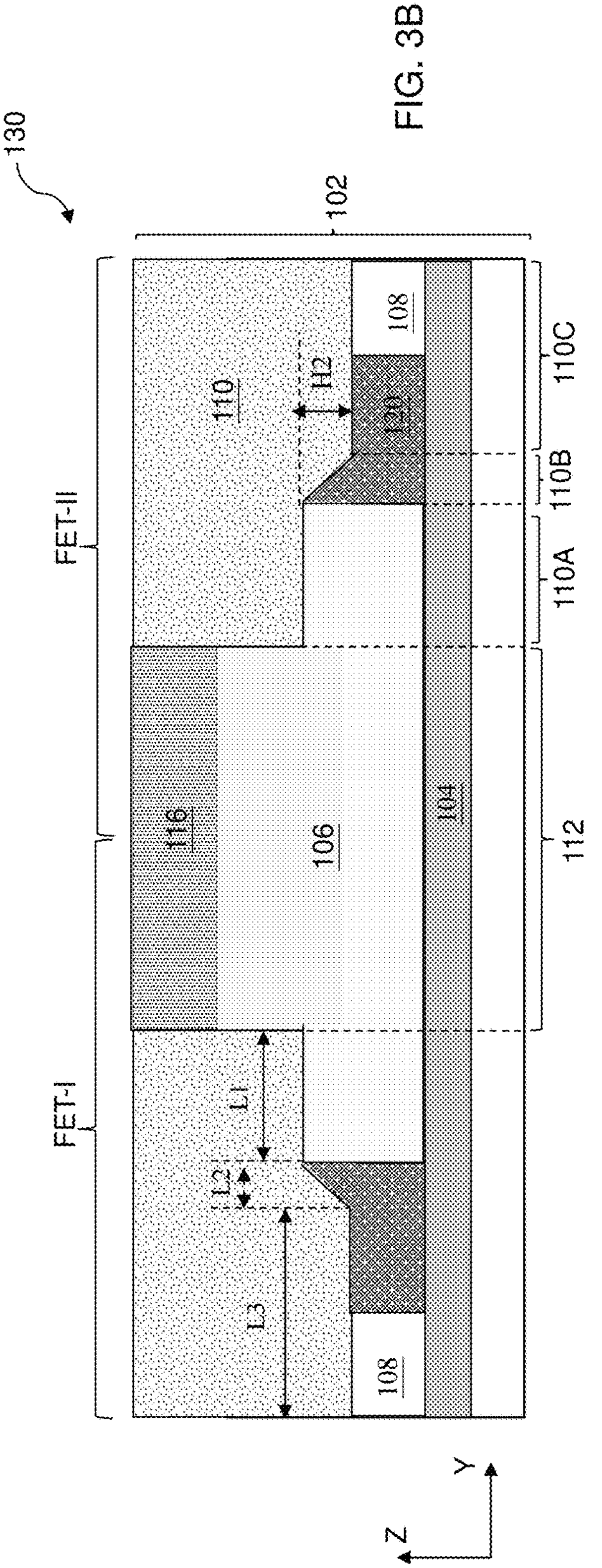
FIG. 3B is a cross-sectional view of the IC structure of FIG. 3A, in portion, according to some embodiments of the present disclosure.

FIG. 2A is a top view of an IC structure 130 having one or more high voltage FET, and FIG. 2B is a sectional view of the IC structure 130, in portion, cut along the dashed line AA' of FIG. 2A, constructed according to various embodiments. FIG. 3A is a top view of the IC structure 130, and FIG. 3B is a sectional view of the IC structure 130, in portion, cut along the dashed line AA' of FIG. 3A, constructed according to various embodiments. Particularly, FIGS. 2A and 2B only illustrates the STI feature 110 and the active regions 112 for simplicity. The gate structure is not shown in FIG. 3B for simplicity.

In the disclosed embodiments, n-type FET structure, having one or more n-type FET (nFET), is provided as an example for illustration. However, it is not intended to be limiting, the IC structure 130 may, additionally, or alternatively, include a p-type FET structure having one or more p-type FET. The IC structure 130 is similar to the IC structure 100 in FIGS. 1A and 1B. The similar components and characteristics are not repeated for simplicity. However, the STI features 110 in the IC structure 130 are designed differently. Especially, the STI features 110 are non-planar and include stepwise profile engineered to prevent leakage. As illustrated in FIG. 2B, the STI features 110 surrounding the active region includes three regions having different heights: a first region 110A of a first thickness H1, a second region (also referred to as transition region) 110B having a varying height, and a third region 110C having a height H1+H2. The STI feature 110 in the transition region 110B gradually increases from the height H1 to the height H1+H2. H2 ranges between 0.01 μm and 5 μm. The parameter H1 is optimized for its effectiveness. Beyond the range, greater or less, is either expensive or ineffective. The first region 110A spans a dimension L1, the second region 110B spans a dimension L2, and the third region 110C spans a dimension L3 along Y direction. The dimension L2+L3 ranges between 0.01 μm and 5 μm according to some embodiments.

Further referring to FIGS. 3A and 3B, the transition region 110B of the STI feature 110 is aligned with the N-well 106 such that the transition region 110B contacts and enclose the N-well 106. The distance D between the gate structure 118 and the transition region 110B along the Y direction ranges between 0.01 μm and 5 μm according to some embodiments.

Figure 4B:
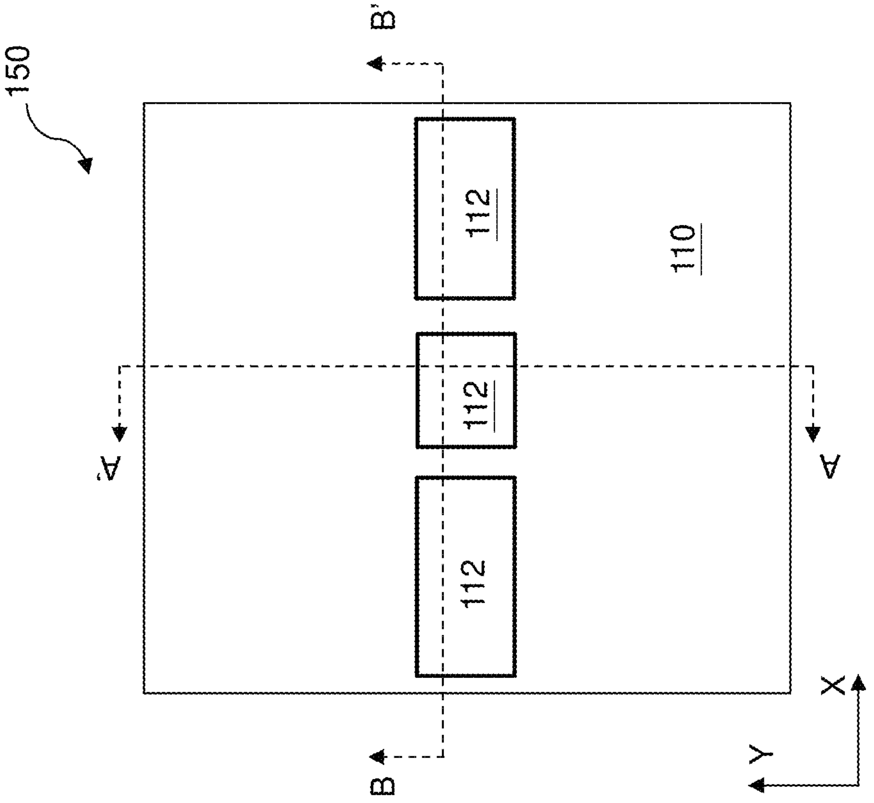
FIG. 4B is a top view of the IC structure, in portion, according to some embodiments of the present disclosure.
Figure 4A:
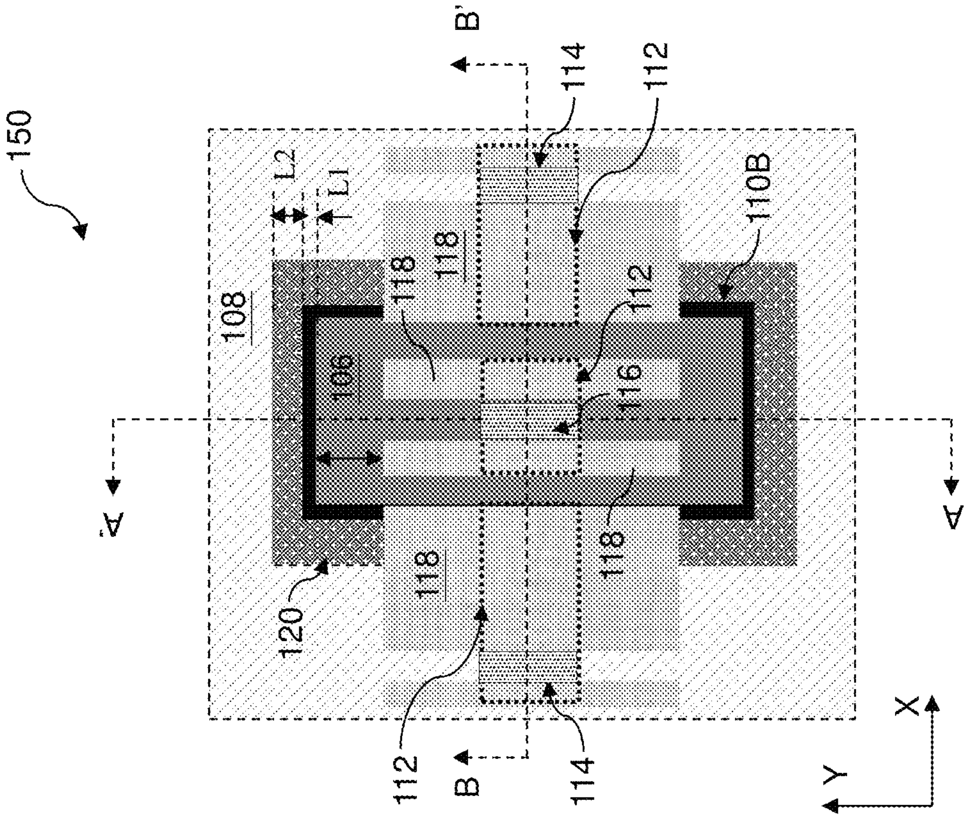
FIG. 4A is a top view of an IC structure according to some embodiments of the present disclosure.
Figure 4C:
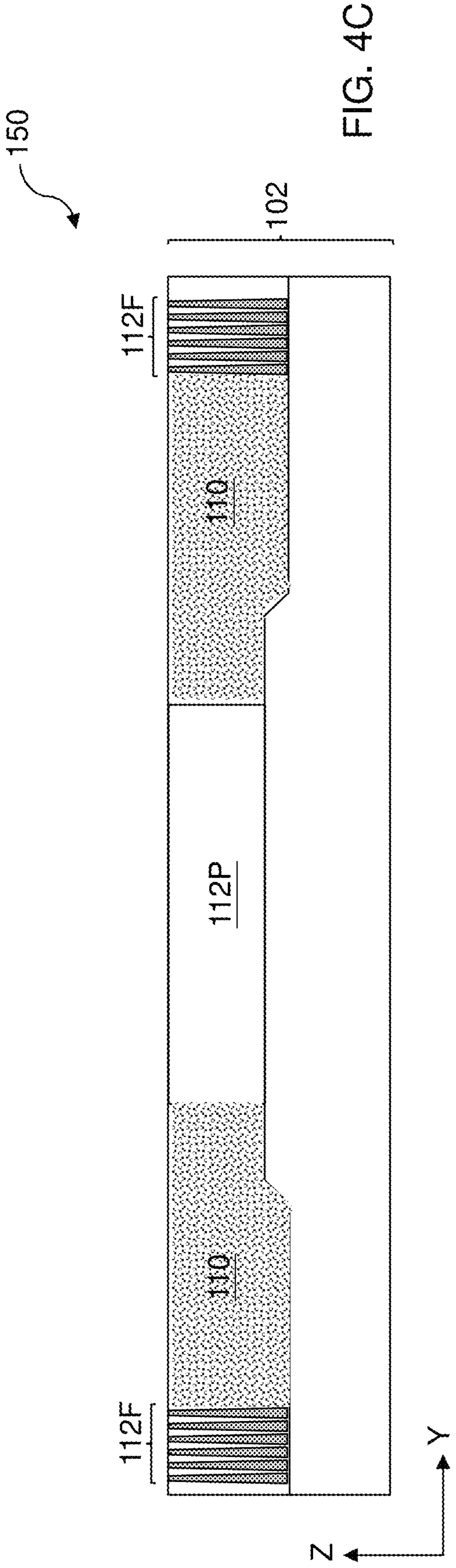
FIG. 4C is a cross-sectional view of the IC structure of FIG. 4A (or 4B), in portion, according to some embodiments of the present disclosure.
Figure 4D:
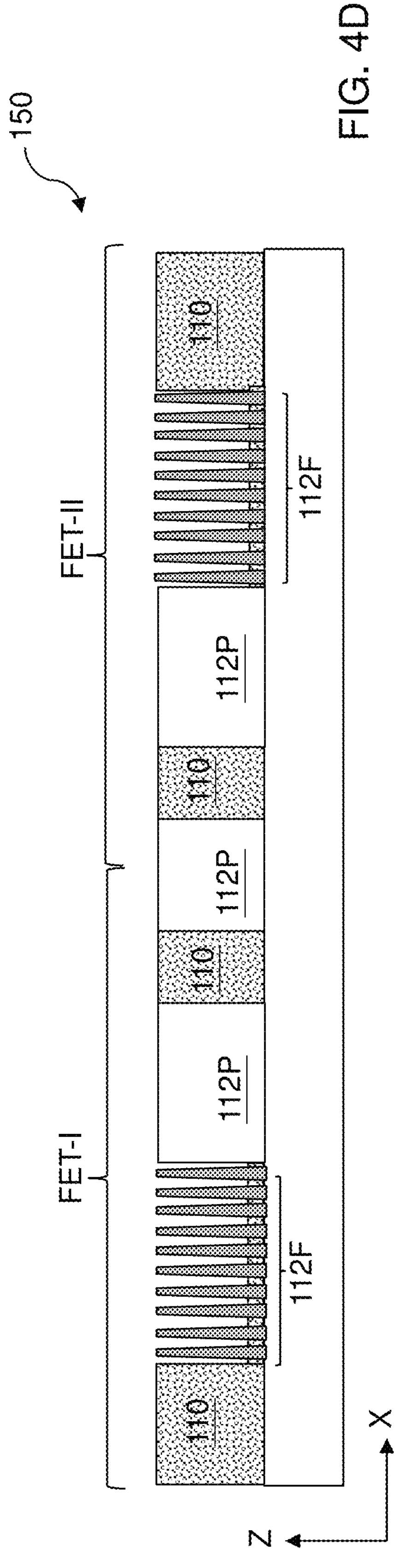
FIG. 4D is a cross-sectional view of the IC structure of FIG. 4A (or 4B), in portion, according to some embodiments of the present disclosure.

FIG. 4A is a top view of an IC structure 150 having one or more high voltage FET, and FIG. 4B is a top view of the IC structure 150, in portion, constructed according to various embodiments. FIG. 4C is a sectional view of the IC structure 150, in portion, cut along the dashed line AA' of FIG. 4A (or 4B); and FIG. 4D is a sectional view of the IC structure 150, in portion, cut along the dashed line BB' of FIG. 4A (or 4B), constructed according to various embodiments. Especially, the FIGS. 4B, 4C and 4D only illustrate the STI feature 110 and the active regions 112 for simplicity.

The IC structure 150 includes n-type FET structure, having one or more nFET, such as two nFETs sharing a common drain. The IC structure 150 is similar to the IC structure 130 in term of structure. The similar components and characteristics are not repeated for simplicity. For example, the STI feature 110 includes a stepwise profile having different regions with different thicknesses. However, the IC structure 150 includes active regions 112 having both planar active regions and fin active regions. A planar active region is an active region with a top planar surface while fin active regions are a cluster of active regions each having side surfaces and a top surface collectively contributing to the coupling between the corresponding gate and channel.

As illustrated in FIG. 4B, the IC structure 150 includes three active regions 112, left, central and right active regions. In the disclosed embodiments, those active regions 112 have a hybrid structure that further includes planar active regions 112P and fin active regions 112F, as illustrated in FIGS. 4C and 4D. Especially, as illustrated in FIG. 4D, along X direction, the central active region 112 includes a first planar active region 112P interposed between the two portions of the STI feature 110. The left active region 112 includes a second planar active region 112P disposed on side of the STI feature 110 in the first nFET and first fin active regions 112F disposed on the side of the second planar active region 112P in the first nFET. The right active region 112 includes a third planar active region 112P disposed on side of the STI feature 110 in the second nFET and second fin active regions 112F disposed on the side of the third planar active region 112P in the second nFET. In other words, each of the left and right active regions 112 are hybrid.

As illustrated in FIG. 4C, along Y direction, the active regions 112 include a planar active region 112P interposed between the two portions of the STI feature 110, fin active regions 112F disposed on the regions (not shown in FIG. 4A) beyond the P-well 108.

The common drain 116 is formed in the first planar active region 112P. The source 114 of the first nFET is formed on the first fin active regions 112F. The source 114 of the second nFET is formed on the second fin active regions 112F. The gate structure 118 (specifically the second segment as functional gate) for each nFET is formed partially on the fin active regions 112F and partially on the planar active region 112P, which is further described in detail below with reference to FIGS. 5A, 5B, and 6A-6G.

Figure 5B:
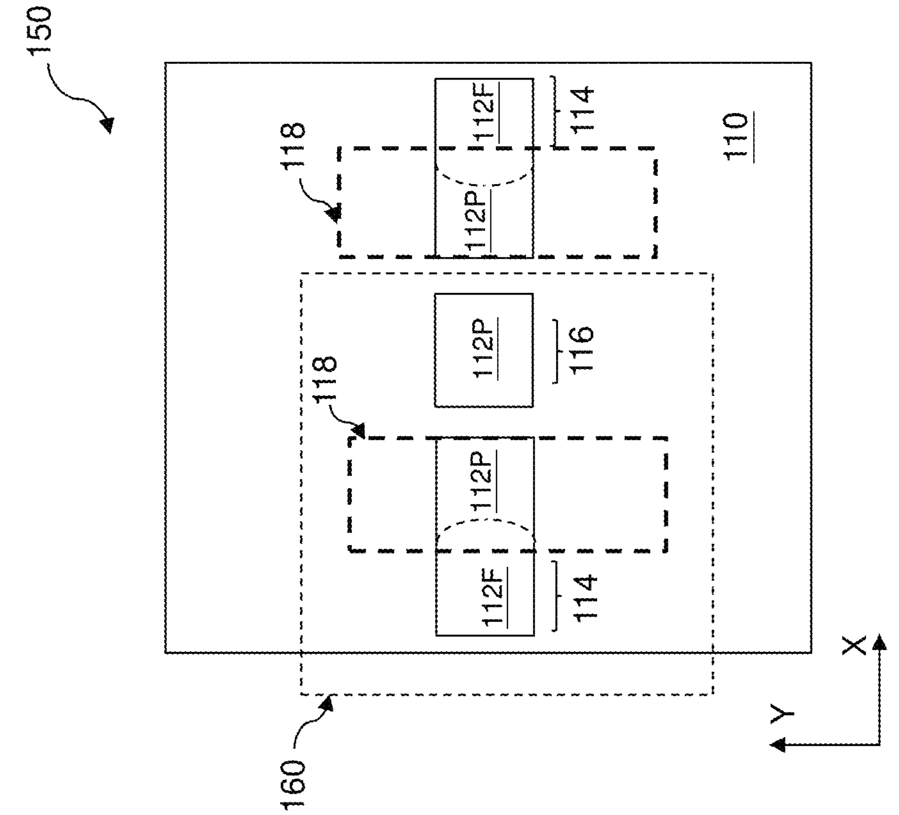
FIG. 5B is a top view of the IC structure, in portion, according to some embodiments of the present disclosure.
Figure 5A:
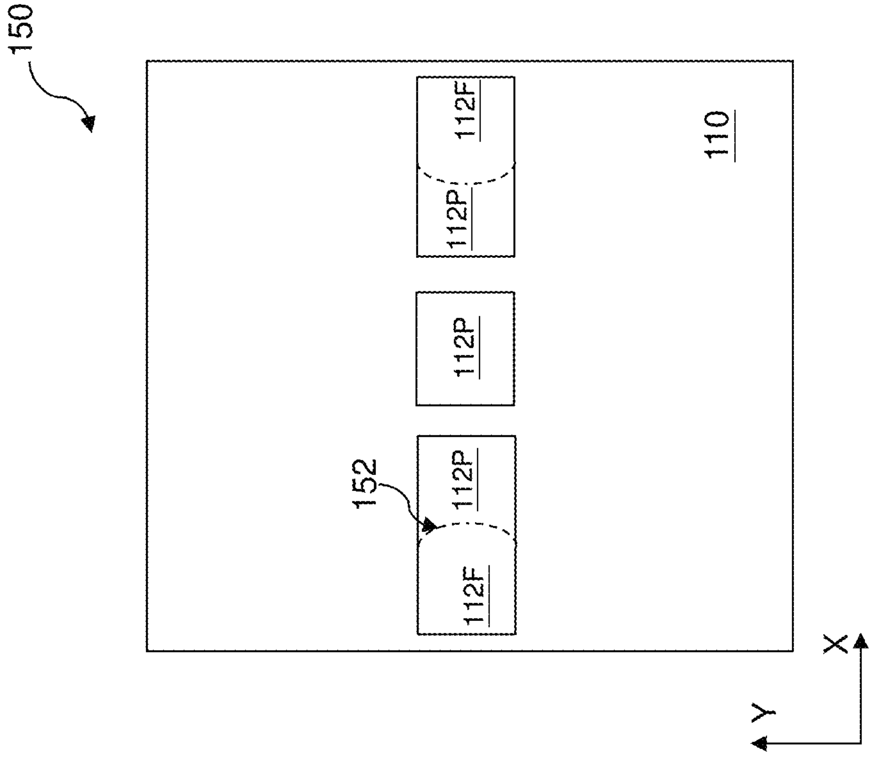
FIG. 5A is a top view of an IC structure, in portion, according to some embodiments of the present disclosure.

FIG. 5A is a top view of the IC structure 150, in portion; FIG. 5B is a top view of the IC structure 150, in portion; and FIGS. 6A through 6G are top views of the IC structure 150, in portion, constructed according to various embodiments. Especially, for simplicity, FIG. 5A only illustrates the STI feature 110 and the active regions 112; FIG. 5B only illustrates the STI feature 110, the active regions 112, the source 114, the drain 116 and the gate 118; and FIGS. 6A-6G illustrate portions of the active regions 112, the source 114, the drain 116 and the gate structure 118 in the dashed box 160 of FIG. 5B.

FIG. 5A is similar to FIG. 4B, the active regions 112 are illustrated. However, in FIG. 5A, the planar active regions 112P and the fin active regions 112F of the active regions 112 are further illustrated. Especially, the fin active regions 112F and the planar active region 112P has an interface 152, which may not be a straight line in the top view.

FIG. 5B is similar to FIG. 5A but the source 114, the drain 116, and the gate structure 118 are further illustrated. As can be seen, the common drain 116 is formed on the planar active region 112P, the source 114 is formed on the fin active regions 112F, and the gate structure 118 is formed over the fin active regions 112F and the planar active region 112P. In FIG. 5B, the gate structure 118 is illustrated by a transparent box of a dashed line so that the underlying planar and fin active regions can be seen. Note the segment of the gate structure 118 over the central active region 112 is floating and is not shown in FIG. 5B for simplicity.

Furthermore, the interface 152 between the planar active region 112P and the fin active regions 112F is overlapped with the gate structure 118 and can be in any proper geometry in the top view, which is further illustrated in FIGS. 6A through 6G according to various embodiments.

Figure 6E:
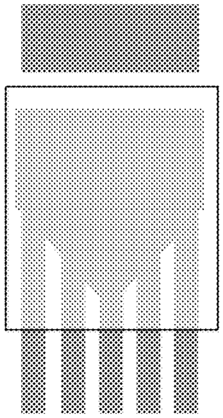
FIGS. 6A, 6B, 6C, 6D, 6E, 6F, and 6G are top views of the IC structure, in portion, constructed according to various embodiments of the present disclosure.
Figure 6F:
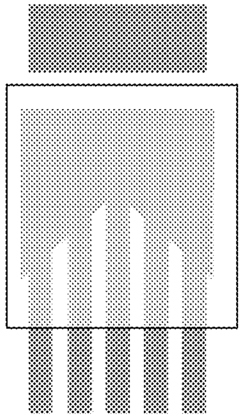
Figure 6G:
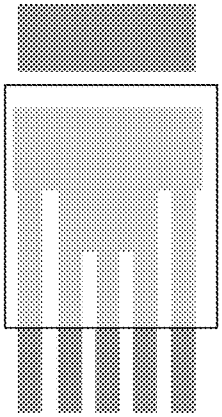
Figure 6B:
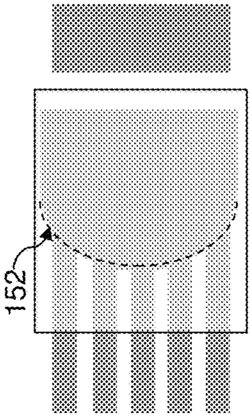
Figure 6C:
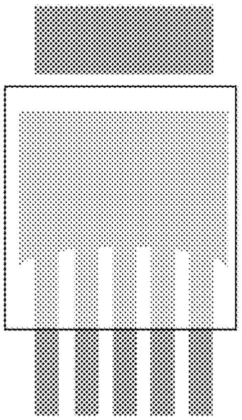
Figure 6D:
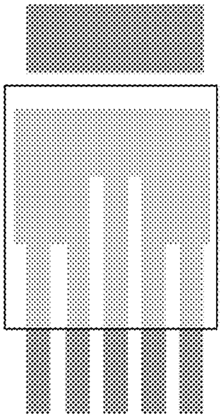
Figure 6A:
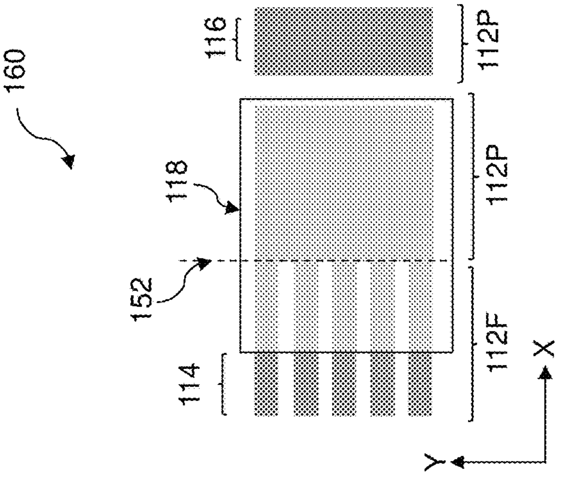

In FIG. 6A, the active regions 112 are illustrated in the top view. The drain 116 is formed on the planar active region 112P; the source 114 is formed on the fin active regions 112F; and the gate structure 118 is formed partially on the fin active regions 112F and partially on the planar active region 112P. The interface 152 between the planar active region 112P and the fin active regions 112F is overlapped with the gate structure 118 and is a straight line in the top view. In FIG. 6B, the interface 152 is a curved line in the top view. The interface 152 can have any proper geometry, such as those illustrated in FIGS. 6C through 6G. By tuning the geometry of the interface 152 between the planar active region 112P and the fin active regions 112F, the high voltage FET is further tuned with enhanced performance including increased breakdown voltage and reduced leakage current.

Figure 7:
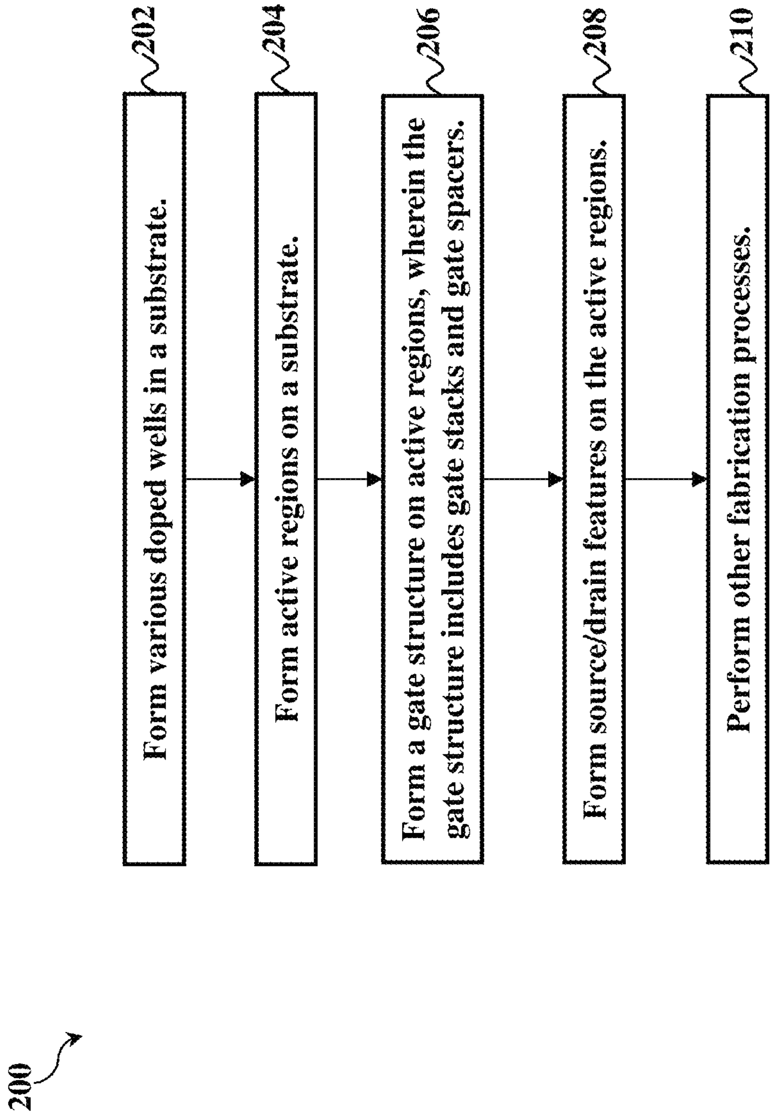
FIG. 7 is a flowchart of a method making an IC structure, according to some embodiments of the present disclosure.

FIG. 7 is a flowchart of a method 200 making an IC structure 100 having one or more high voltage FET according to some embodiments. The method 200 includes an operation 202 by forming various doped wells, such as the p-type doped well 104, N-well 106 and p-well 108, on a substrate 102. Various doped wells are formed by a suitable method, such as ion implantation, diffusion, other suitable method, or a combination thereof. In the disclosed embodiment, the p-type doped well 104 is formed at a deep level using an ion implantation and a lithography process. In furtherance of the embodiment, a hard mask is formed by a procedure that includes forming a implantation mask layer (such as silicon oxide); and performing a lithography process and etch to pattern the mask layer with an opening that defines a region for the p-type doped well 104. An ion implantation is performed to introduce p-type dopant, such as boron, to form the p-type doped well 104.

The n-well 106 and the P-well 108 are formed similarly. However, the implantation depth is less than the p-type doped well 104 so that the n-well 106 and the P-well 108 are formed above the p-type doped well 104. Furthermore, the N-well 106 and the P-well 108 are defined such that the P-well 108 surrounding the N-well 106 with a gap that define the neutral region 120 without doping.

The method 200 includes an operation 204 by forming active regions 112 on a substrate 102 and an isolation structure 110 that is surrounding the active regions 112 separate the active regions 112 from each other. The substrate 102 is a semiconductor substrate. In some embodiments, the substrate 102 is a silicon substrate, or other suitable semiconductor substrate. In some embodiments, the isolation structure 110 is a shallow trench isolation (STI) structure. In various embodiments, the active regions 112 includes planar active regions, fin active regions, other suitable active regions (such as active regions having multiple channels vertically stacked, such as gate-all-around structure) or a combination thereof. In the disclosed embodiment, the active regions include planar active regions 112P and fin active regions 112F. In some embodiments, the method to form the STI structure 110 and the active regions 112P and 112F includes lithography process and etch to pattern the substrate to form fin active regions 112F and trenches; depositing one or more dielectric material to fill in the trenches; and performing a chemical mechanical polishing (CMP) to planarize the top surface. The method may further include etching to recess the filled dielectric material to form the STI structure 110. In some embodiments, the etching process to recess the filled dielectric material only applied to the fin active regions 112F, such as through a procedure that includes forming a mask layer covering the planar active regions 112P; and etching to recess the dielectric material within fin active regions 112F. Particularly, the interface between the planar active region 112P and the fin active regions 112F is overlapped with the gate structure 118 and may be a straight line in the top view as illustrated in FIG. 6A, or alternatively a curved line in the top view, such as those illustrated in FIGS. 6C through 6G.

The method 200 includes an operation 206 by forming a gate structure over the active regions 112F and 112P. The gate structure is formed on the active regions and is overlying the channel regions. The gate structure includes gate stacks and gate spacers disposed on sidewalls of the gate stacks. In some embodiments, the gate stacks are functional gate stacks each including a gate dielectric layer (such as high-K dielectric material) and a gate electrode (such as one or more metal). In some embodiments, the gate stacks are dummy gate stacks including polysilicon and are replaced by the functional gate stack at later stage. Especially, when the gate stacks are formed, the gate materials are patterned to have various segments, such as illustrated in FIGS. 1A and 1B.

The gate stacks 118 includes the gate dielectric layer and a gate electrode disposed on the gate dielectric layer. In the present embodiment, the gate dielectric layer includes a high-k dielectric material, and the gate electrode includes metal or metal alloy. In some examples, the gate dielectric layer and the gate electrode each may include a plurality of sub-layers. The high-k dielectric material may include metal oxide, metal nitride, such as LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), or other suitable dielectric materials. The gate electrode may include Ti, Ag, Al, TiAlN, TaC, TaCN, TaSiN, Mn, Zr, TiN, TaN, Ru, Mo, WN, Cu, W, Ru, Co, or any suitable conductive materials. In some embodiments, different metal materials are used for nFET and pFET devices with respective work functions to enhance device performance. The gate dielectric layer may further include an interfacial layer sandwiched between the high-k dielectric material layer and the corresponding fin active region 106. The interfacial layer may include silicon oxide, silicon nitride, silicon oxynitride, and/or other suitable material. The interfacial layer is deposited by a suitable method, such as ALD, CVD, ozone oxidation, etc. The high-k dielectric layer is deposited on the interfacial layer (if the interfacial layer presents) by a suitable technique, such as ALD, CVD, metal-organic CVD (MOCVD), PVD, thermal oxidation, combinations thereof, and/or other suitable techniques.

The gate electrode may include multiple conductive materials. In some embodiments, the gate electrode includes a capping layer, a blocking layer, a work function metal layer, another blocking layer and a filling metal layer. In furtherance of the embodiments, the capping layer includes titanium nitride, tantalum nitride, or other suitable material, formed by a proper deposition technique such as ALD. The blocking layer includes titanium nitride, tantalum nitride, or other suitable material, formed by a proper deposition technique such as ALD. The work functional metal layer includes a conductive layer of metal or metal alloy with proper work function such that the corresponding FET is enhanced for its device performance. The work function (WF) metal layer is different in composition for a pFET and a nFET in the second region, respectively referred to as an p-type WF metal and a n-type WF metal. Particularly, an n-type WF metal is a metal having a first work function such that the threshold voltage of the associated nFET is reduced. The n-type WF metal is close to the silicon conduction band energy (Ec) or lower work function, presenting easier electron escape. For example, the n-type WF metal has a work function of about 4.2 eV or less. A p-type WF metal is a metal having a second work function such that the threshold voltage of the associated pFET is reduced. The p-type WF metal is close to the silicon valence band energy (Ev) or higher work function, presenting strong electron bonding energy to the nuclei. For example, the p-type work function metal has a WF of about 5.2 eV or higher. In some embodiments, the n-type WF metal includes tantalum (Ta). In other embodiments, the n-type WF metal includes titanium aluminum (TiAl), titanium aluminum nitride (TiAlN), or combinations thereof. In other embodiments, the n-metal include Ta, TiAl, TiAlN, tungsten nitride (WN), or combinations thereof. In some embodiments, the p-type WF metal includes titanium nitride (TiN) or tantalum nitride (TaN). In other embodiments, the p-metal include TiN, TaN, tungsten nitride (WN), titanium aluminum (TiAl), or combinations thereof. The work function metal is deposited by a suitable technique, such as PVD. The n-type WF metal or the p-type WF metal may include various metal-based films as a stack for optimized device performance and processing compatibility. In various embodiments, the filling metal layer includes aluminum, tungsten, copper or other suitable metal. The filling metal layer is deposited by a suitable technique, such as PVD or plating. The gate stacks are formed by a suitable method such as a procedure that includes depositions and patterning using lithography process and etching.

The gate spacers may include any suitable dielectric material, such as a semiconductor oxide, a semiconductor nitride, a semiconductor carbide, a semiconductor oxynitride, other suitable dielectric materials, and/or combinations thereof. The spacers may have multiple films, such as two films (a silicon oxide film and a silicon nitride film) or three films ((a silicon oxide film; a silicon nitride film; and a silicon oxide film). The formation of the spacers may include deposition and anisotropic etching, such as dry etching.

The method 200 includes an operation 208 by forming source features 114 and drain features 116 on the active regions, such as sources 114 and a common drain 116 illustrated in FIGS. 1A and 1B. In some embodiments, the sources 114 are formed on fin active regions 112F and the drain 116 is formed on a planar active region 112P. The sources 114 and the drains 116 are formed by any suitable method, such as ion implantation, diffusion, epitaxial growth or a combination thereof. In the disclosed embodiment, sources 114 and drains 116 are formed by selective epitaxial growth for strain effect with enhanced carrier mobility and device performance. In some embodiments, the sources 114 and drains 116 are formed by one or more epitaxial (epi) processes, whereby Si features, SiGe features, SiC features, and/or other suitable features are grown in a crystalline state on the active regions. Alternatively, an etching process is applied to recess the source/drain regions before the epitaxial growth. Suitable epitaxial processes include CVD deposition techniques (e.g., vapor-phase epitaxy (VPE) and/or ultra-high vacuum CVD (UHV-CVD), molecular beam epitaxy, and/or other suitable processes). The epitaxial process may use gaseous and/or liquid precursors, which interact with the composition of the substrate. In some embodiments, adjacent sources/drains may be grown to merge together to provide increased contact area and reduce the contact resistance. This can be achieved by controlling the epitaxial growth process.

The sources 114 and drains 116 may be in-situ doped during the epitaxial process by introducing doping species including: p-type dopants, such as boron or $BF_2$; n-type dopants, such as phosphorus or arsenic; and/or other suitable dopants including combinations thereof. If the sources 114 and drains 116 are not in-situ doped, an implantation process is performed to introduce the corresponding dopant into the sources and drains. In an embodiment, the sources 114 and drains 116 in an nFET include SiC or Si doped with phosphorous, while those in a pFET include Ge or SiGe doped with boron. In some other embodiments, the raised sources and drains include more than one semiconductor material layers. For example, a silicon germanium layer is epitaxially grown on the substrate within the source/drain regions and a silicon layer is epitaxially grown on the silicon germanium layer. One or more annealing processes may be performed thereafter to activate the sources and drains. Suitable annealing processes include rapid thermal annealing (RTA), laser annealing processes, other suitable annealing technique or a combination thereof.

The method 200 may include other fabrication processes 210 implemented before, during or after the operations described above. For example, the method 200 may include an operation to form a protection layer on top of the gate stacks 108 to protect the gate stacks 110 from loss during subsequent processing. The protection layer may include a suitable material different from the dielectric material of ILD layers to achieve etching selectivity during the etching process to form contact openings. In some embodiments, the protection layer includes silicon nitride. In other examples, the method 200 includes forming an interconnection structure on the semiconductor substrate 102 to connect various FETs and other devices into a circuit. The interconnection structure includes contacts, vias and metal lines formed through a suitable process. In the copper interconnection, the conductive features include copper and may further include a barrier layer. The copper interconnect structure is formed by a damascene process. A damascene process includes depositing an ILD layer; patterning the ILD layer to form trenches; depositing various materials (such as a barrier layer and copper); and performing a CMP process. A damascene process may be a single damascene process or a dual damascene process. The deposition of the copper may include PVD to form a seed layer and plating to form bulk copper on the copper seed layer. Other metals, such as ruthenium, cobalt, tungsten or aluminum, may be used to form the interconnection structure. In some embodiments, prior to filling conductive material in contact holes, silicide may be formed on the sources 114 and drains 116 to further reduce the contact resistance. The silicide includes silicon and metal, such as titanium silicide, tantalum silicide, nickel silicide or cobalt silicide. The silicide may be formed by a process referred to as self-aligned silicide (or salicide). The process includes metal deposition, annealing to react the metal with silicon, and etching to remove unreacted metal. In some other embodiments, some other metal, such as ruthenium or cobalt, may be used for contacts and/or vias.

The present disclosure provides an IC structure having one or more HVFET device and a method making the same. As described above, the IC structure includes various features to enhance the HVFET device performance, including the neutral region 120, the hybrid active region, the stepwise profile of the STI feature 110, fragmented gate structure 118, and the various geometry of the interface between the fin active regions 112F and the planar active region 112P. Various features are implemented in the disclosed IC structure to achieve the enhanced performance including increased breakdown voltage, reduced leakage current and increased current in the On state. Furthermore, the HVFET device of the IC structure may be formed on the planar active regions, fin active regions, or formed with other three-dimensional FET structure, such as a nano structure having multiple channels vertically stacked, such as a gate-all-around (GAA) structure, or a CFET structure with a nFET and a pFET vertically stacked on each other.

In one example aspect, the present disclosure provides an embodiment of an integrated circuit (IC) structure. The IC structure includes a semiconductor substrate; an isolation structure formed in the semiconductor substrate, thereby defining active regions surrounded by the isolation feature; a first well of a first conductivity type formed in the semiconductor substrate; a neutral region formed in the semiconductor substrate and laterally surrounding the first well; a second well of a second conductivity type formed on the semiconductor substrate and laterally surrounding the neutral region, the second conductivity type being opposite to the first conductivity type; a source disposed on the second well of the semiconductor substrate; a drain disposed on the first well of the semiconductor substrate; and a gate structure interposed between the source and the drain. The gate structure is engaging the first well, the neutral region and the second well of the semiconductor substrate. The source, the drain and the gate structure are configured as a first field-effect transistor (FET).

In another example aspect, the present disclosure provides an embodiment of an integrated circuit (IC) structure. The IC structure includes a semiconductor substrate; a shallow trench isolation (STI) feature formed in the semiconductor substrate, thereby defining active regions surrounded by the STI feature; a first well of a first conductivity type disposed on the semiconductor substrate; a neutral region disposed on the semiconductor substrate and laterally surrounding the first well; a second well of a second conductivity type disposed on the semiconductor substrate and laterally surrounding the neutral region, the second conductivity type being opposite to the first conductivity type; and a first field-effect transistor (FET) and a second FET formed on the semiconductor substrate. The first FET includes a first source disposed on the second well, a drain disposed on the first well, and a first gate structure interposed between the first source and the drain. The first gate structure is landing on the first well, the neutral region and the second well. The second FET includes a second source disposed on the second well, the drain, and a second gate structure interposed between the second source and the drain. The second gate structure is landing on the first well, the neutral region and the second well.

In yet another example aspect, the present disclosure provides one embodiment of a method making a high-voltage field-effect transistor. The method includes forming a first well of a first conductivity type in a semiconductor substrate; forming a second well of a second conductivity type on the semiconductor substrate such that the second well is laterally enclosing the first well and is distanced from the first well with a neutral region between the first and second wells, the second conductivity type being opposite to the first conductivity type; forming active regions surrounded by an isolation structure having an uneven thickness, wherein the active regions include planar active regions and fin active regions; forming a source in the second well; forming a drain in the first well; and forming a gate structure interposed between the source and the drain, the gate structure being disposed on the first well, the neutral region and the second well.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) structure, comprising:
- a semiconductor substrate;
- an isolation structure formed in the semiconductor substrate, thereby defining active regions surrounded by the isolation structure;
- a first well of a first conductivity type formed in the semiconductor substrate;
- a neutral region formed in the semiconductor substrate and laterally surrounding the first well;
- a second well of a second conductivity type formed on the semiconductor substrate and laterally surrounding the neutral region, the second conductivity type being opposite to the first conductivity type;
- a source disposed on the second well of the semiconductor substrate;
- a drain disposed on the first well of the semiconductor substrate; and
- a gate structure interposed between the source and the drain, the gate structure engaging the first well, the neutral region and the second well of the semiconductor substrate, wherein the source, the drain and the gate structure are configured as a first field-effect transistor (FET).

2. The IC structure of claim 1, wherein the isolation structure is a shallow trench isolation (STI) feature that includes a portion formed in the first well and disposed between the source and the drain.

3. The IC structure of claim 2, wherein
- the STI feature has an uneven structure that includes a first segment of a first thickness, a second segment of a second thickness, and a transition segment connecting the first and second segments of the STI features;
- the second thickness is greater than the first thickness; and
- the transition segment of the STI feature has a varying thickness and is overlapped with the neutral region in a top view.

4. The IC structure of claim 2, wherein the gate structure includes a first segment and a second segment interposed by the portion of the STI feature, wherein
- the first segment of the gate structure is disposed directly on the neutral region and spans between the source and the portion of the STI feature along a first direction,
- the second segment of the gate structure is disposed directly on the first well and spans between the portion of the STI feature and the drain,
- the first segment is configured to be electrically connected to a power signal line, and
- the second segment of the gate structure is configured to be floating.

5. The IC structure of claim 4, wherein
- the first segment and the second segment of the gate structure are longitudinally oriented along a second direction being orthogonal to the first direction; and
- the first segment of the gate structure is partially overlapped with the first well and the second well in the top view.

6. The IC structure of claim 1, further comprising a deep well of the second conductivity type, wherein
- the source and the drain are doped features of the first conductivity type, and
- the first well and the second well are disposed on the deep well and are overlapped with the deep well in a top view.

7. The IC structure of claim 1, wherein the active regions include planar active regions and fin active regions.

8. The IC structure of claim 7, wherein the planar active regions and the fin active regions include an interface having a curved line in a top view.

9. The IC structure of claim 8, wherein
- the source is formed on the fin active regions;
- the drain is formed on the planar active regions; and
- the gate structure is formed on both the planar active regions and the fin active regions and is overlapped with the interface of the planar active regions and the fin active regions in the top view.

10. The IC structure of claim 9, wherein the source has multiple portions formed on the fin active regions, respectively.

11. The IC structure of claim 1, wherein the gate structure is a first gate structure, and the source is a first source, wherein the IC structure further includes a second source disposed in the second well of the semiconductor substrate; and a second gate structure interposed between the second source and the drain, the gate structure engaging the first well, the neutral region and the second well of the semiconductor substrate, wherein the second source, the drain and the second gate structure are configured as a second FET.

12. An integrated circuit (IC) structure, comprising:

a semiconductor substrate;

a shallow trench isolation (STI) feature formed in the semiconductor substrate, thereby defining active regions surrounded by the STI feature;

a first well of a first conductivity type disposed on the semiconductor substrate;

a neutral region disposed on the semiconductor substrate and laterally surrounding the first well;

a second well of a second conductivity type disposed on the semiconductor substrate and laterally surrounding the neutral region, the second conductivity type being opposite to the first conductivity type; and a first field-effect transistor (FET) and a second FET formed on the semiconductor substrate, wherein the first FET includes a first source disposed on the second well, a drain disposed on the first well, and a first gate structure interposed between the first source and the drain, the first gate structure landing on the first well, the neutral region and the second well, and the second FET includes a second source disposed on the second well, the drain, and a second gate structure interposed between the second source and the drain, the second gate structure landing on the first well, the neutral region and the second well, wherein the first gate structure includes a first segment and a second segment interposed by the first portion of the STI feature;

the first segment of the first gate structure is disposed directly on the neutral region and spans between the first source and the first portion of the STI feature along a first direction;

the second segment of the first gate structure is disposed directly on the first well and spans between the first portion of the STI feature and the drain; and the second segment of the first gate structure is configured to be floating.

13. The IC structure of claim 12, wherein the STI feature further includes a first portion formed in the first well and disposed between the first source and the drain, and a second portion formed in the first well and disposed between the second source and the drain.

14. The IC structure of claim 13, wherein the second gate structure includes a third segment and a fourth segment interposed by the second portion of the STI feature;

the third segment of the second gate structure is disposed directly on the neutral region and spans between the second source and the second portion of the STI feature along the first direction;

the fourth segment of the second gate structure is disposed directly on the first well and spans between the second portion of the STI feature and the drain; and the fourth segment of the second gate structure is configured to be floating.

15. The IC structure of claim 14, wherein the active regions include a first planar active region, a second planar active region, a third planar active region, first fin active regions, and second fin active regions;

the first planar active region spans between the first portion and the second portion of the STI feature, the drain being formed on the first planar active region;

the second planar active region spans between the first fin active regions and the first portion of the STI feature and contacts the first fin active regions with a first curved interface, the first source being disposed on the first fin active regions; and the third planar active region spans between the second fin active regions and the second portion of the STI feature and contacts the second fin active regions with a second curved interface, the second source being disposed on the second fin active regions.

16. The IC structure of claim 14, wherein the STI feature includes a first segment of a first thickness, a second segment of a second thickness, a transition segment connecting the first and second segments of the STI features;

the second thickness is greater than the first thickness; and the transition segment of the STI feature has a varying thickness and is overlapped with the neutral region in a top view.

17. An integrated circuit (IC) structure, comprising:

a semiconductor substrate;

a shallow trench isolation (STI) feature formed in the semiconductor substrate, thereby defining active regions surrounded by the STI feature;

a first well of a first conductivity type disposed on the semiconductor substrate;

a neutral region disposed on the semiconductor substrate and laterally surrounding the first well;

a second well of a second conductivity type disposed on the semiconductor substrate and laterally surrounding the neutral region, the second conductivity type being opposite to the first conductivity type; and a first field-effect transistor (FET) and a second FET formed on the semiconductor substrate, wherein the first FET includes a first source disposed on the second well, a drain disposed on the first well, and a first gate structure interposed between the first source and the drain, the first gate structure landing on the first well, the neutral region and the second well, and the second FET includes a second source disposed on the second well, the drain, and a second gate structure interposed between the second source and the drain, the second gate structure landing on the first well, the neutral region and the second well, wherein the STI feature further includes a first portion formed in the first well and interposed between the first source and the drain, and a second portion formed in the first well and interposed between the second source and the drain;

the first gate structure includes a first segment and a second segment interposed by the first portion of the STI feature; and the second gate structure includes a third segment and a fourth segment interposed by the second portion of the STI feature.

18. The IC structure of claim 17, wherein the first segment of the first gate structure is disposed directly on the neutral region and spans between the first source and the first portion of the STI feature along a first direction;

the second segment of the first gate structure is disposed directly on the first well and spans between the first portion of the STI feature and the drain;

the third segment of the second gate structure is disposed directly on the neutral region and spans between the second source and the second portion of the STI feature along the first direction;

the fourth segment of the second gate structure is disposed directly on the first well and spans between the second portion of the STI feature and the drain; and the second segment of the first gate structure and the fourth segment of the second gate structure are configured to be floating.

19. The IC structure of claim 17, wherein the active regions include a first planar active region, a second planar active region, a third planar active region, first fin active regions, and second fin active regions;

the first planar active region spans between the first portion and the second portion of the STI feature, the drain being formed on the first planar active region;

the second planar active region spans between the first fin active regions and the first portion of the STI feature and contacts the first fin active regions with a first curved interface, the first source being disposed on the first fin active regions; and the third planar active region spans between the second fin active regions and the second portion of the STI feature and contacts the second fin active regions with a second curved interface, the second source being disposed on the second fin active regions.

20. The IC structure of claim 17, wherein the STI feature includes a first segment of a first thickness, a second segment of a second thickness, a transition segment connecting the first and second segments of the STI feature;

the second thickness is greater than the first thickness; and the transition segment of the STI feature has a varying thickness and is overlapped with the neutral region in a top view.

* * * * *